(12) United States Patent
Yi

(10) Patent No.: US 10,242,637 B2
(45) Date of Patent: Mar. 26, 2019

(54) CMOS GOA CIRCUIT

(71) Applicant: Wuhan China Star Optoelectronics Technology Co., Ltd., Wuhan (CN)

(72) Inventor: Shijuan Yi, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 189 days.

(21) Appl. No.: 15/506,242

(22) PCT Filed: Feb. 17, 2017

(86) PCT No.: PCT/CN2017/073877
§ 371 (c)(1),
(2) Date: Feb. 24, 2017

(87) PCT Pub. No.: WO2018/120380
PCT Pub. Date: Jul. 5, 2018

(65) Prior Publication Data
US 2018/0218701 A1    Aug. 2, 2018

(30) Foreign Application Priority Data

Dec. 28, 2016 (CN) .......................... 2016 1 1235677

(51) Int. Cl.
*G11C 19/00* (2006.01)
*G09G 3/36* (2006.01)
*G11C 19/28* (2006.01)

(52) U.S. Cl.
CPC ......... *G09G 3/3677* (2013.01); *G09G 3/3696* (2013.01); *G11C 19/28* (2013.01); *G09G 2300/0408* (2013.01); *G09G 2300/0819* (2013.01); *G09G 2310/0286* (2013.01); *G09G 2310/0289* (2013.01); *G09G 2310/0291* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2016/0307533 | A1* | 10/2016 | Cao | G09G 3/3677 |
| 2016/0365050 | A1* | 12/2016 | Qing | G09G 3/3677 |
| 2017/0004796 | A1* | 1/2017 | Zhao | G09G 3/3677 |
| 2017/0039973 | A1* | 2/2017 | Huang | G09G 3/36 |
| 2017/0084238 | A1* | 3/2017 | Cao | G09G 3/3266 |
| 2017/0140723 | A1* | 5/2017 | Zhao | G09G 3/3648 |
| 2017/0163203 | A1* | 6/2017 | Hambloch | B62D 5/0496 |
| 2017/0193946 | A1* | 7/2017 | Huang | G09G 3/3677 |
| 2017/0247477 | A1* | 8/2017 | Colvin | B60C 1/00 |
| 2018/0034462 | A1* | 2/2018 | Zhao | G09G 3/3677 |
| 2018/0151139 | A1* | 5/2018 | Yi | G09G 3/36 |

* cited by examiner

*Primary Examiner* — Tuan T Lam
(74) *Attorney, Agent, or Firm* — Leong C. Lei

(57) ABSTRACT

The invention provides a CMOS GOA circuit, which improves the NAND gate in the latch module and the inverter to connect the latch clock signal to the NAND gate in the latch module or the inverter to control the latch module to realize the input and latch of the cascade signal through the voltage change in the latch clock signal. Compared to the known technique, the present invention reduces the number of TFTs required by the latch module without affecting the normal operation of the circuit, and facilitates the implementation of the narrow border or borderless display products.

17 Claims, 10 Drawing Sheets

CMOS GOA CIRCUIT

BACKGROUND OF THE INVENTION

1. Field of the Invention

The present invention relates to the field of display techniques, and in particular to a complementary metal-oxide-semiconductor (CMOS) gate driver on array (GOA) circuit.

2. The Related Arts

The liquid crystal display (LCD) provides many advantages, such as thinness, low power-consumption and no radiation, and is widely used in, such as, LCD televisions, mobile phones, personal digital assistants (PDAs), digital cameras, computer screens, laptop screens, and so on. The LCD technology also dominates the field of panel displays.

Most of the LCDs on the current market are of backlight type, which comprises an LCD panel and a backlight module. The operation theory behind LCD is to inject the liquid crystal (LC) molecules between a thin film transistor (TFT) array substrate and a color filter (CF) substrate, and applies a driving voltage between the two substrates to control the rotation direction of the LC molecules to refract the light from the backlight module to generate the display on the screen.

In the active LCD, each pixel is electrically connected to a TFT, with a gate connected to a horizontal scan line, a drain connected to a data line in a vertical direction, and a source connected to a pixel electrode. When a sufficient positive voltage is applied to a horizontal scan line, all the TFTs connected to the scan line are turned on, the signal voltage loaded on the data line is written into the pixel to control the transmittance of different liquid crystals to achieve the effect of color control. The driving of the horizontal scan line of the current active LCD is mainly executed by an external integrated circuit (IC). The external IC can control the charge and discharge of the horizontal scan line in each stage progressively. The gate driver on array (GOA) technology, i.e., the array substrate row driving technology, can use the array process of the LCD panel to manufacture the driver circuit of the horizontal scan lines on the substrate at area surrounding the active area to replace the external IC for driving the horizontal scan lines. The GOA technology can reduce the bonding process for external IC and has the opportunity to enhance yield rate and reduce production cost, as well as make the LCD panel more suitable for the production of narrow border display products.

The latch circuit in the known CMOS GOA circuit comprises more TFTs, and is not suitable for narrow border design. Therefore, a novel CMOS GOA circuit to reduce the number of TFTs used to reduce the border size of the display product is imperative.

SUMMARY OF THE INVENTION

The object of the present invention is to provide a CMOS GOA circuit, able to reduce the number of TFTs required by the CMOS GOA circuit to reduce the border size of display products.

To achieve the above object, the present invention provides a CMOS GOA circuit, which comprises a plurality of stages of GOA units, wherein the odd-numbered stages of GOA units being cascaded and the even-numbered stages of GOA units being cascaded;

each GOA unit comprising: a forward-and-backward scan control module, a latch module, an output buffer module, an output module, and a reset module;

for positive numbers N, M and K, other than the GOA units in the first stage, the second stage, the second last stage and the last stage, in each N-th GOA unit:

the forward-and-backward scan control module receiving a cascade signal from the (N−2)-th GOA unit, a cascade signal from the (N+2)-th GOA unit, a forward scan signal and a backward scan signal, for controlling the GOA circuit to perform forward scan or backward scan according to the voltage change of forward scan signal and the backward scan signal, and propagating the cascade signal of the (N−2)-th GOA unit or the cascade signal from the (N+2)-th GOA unit to a first node;

the latch module comprising: a first TFT, a second TFT, a third TFT, a fourth TFT, a fifth TFT, and a sixth TFT; wherein the first TFT, the second TFT and the fifth TFT being P-type TFT and the third TFT, the fourth TFT and the sixth TFT being N-type TFT;

the first TFT having a gate connected to the first node, a source connected to a first control signal and a drain connected to a second node; the second TFT having a gate connected to a cascade signal, a source connected to the first control signal and a drain connected to the second node; the third TFT having a gate connected to the cascade signal, a source connected to the second node and a drain connected to a source of the fourth TFT; the fourth TFT having a gate connected to the first node, a drain connected to a constant low voltage signal; the fifth TFT having a gate connected to the second node, a source connected to a constant high voltage signal and a drain connected to the cascade signal; and the sixth TFT having a gate connected to the second node, a source connected to a second control signal and a drain connected to the cascade signal;

the output buffer module connected to the cascade signal for inverting the cascade signal and propagating the inverted cascade signal to a third node;

the output module comprising: a first transmission gate and a second transmission gate;

the first transmission gate having a high voltage control end connected to the third node, a low voltage control end connected to the cascade signal, an input end connected to an M-th output clock signal, and an output end connected to a first scan signal; the second transmission gate having a high voltage control end connected to the third node, a low voltage control end connected to the cascade signal, an input end connected to an (M+2)-th output clock signal, and an output end connected to a second scan signal;

the reset module connected to a reset signal, the constant high voltage signal, and the cascade signal, for resetting the cascade signal to a high voltage, and the first scan signal and the second scan signal to a low voltage under the control of the reset signal;

in the GOA units of the (4K−3)-th and (4K−2)-th stages, the first control signal being the constant high voltage signal and the second control signal being a latch clock signal; in the GOA units of the K-th and (4K−1)-th stages, the first control signal being the latch clock signal and the second control signal being the constant low voltage signal.

According to a preferred embodiment of the present invention, the forward-and-backward scan control module comprises: a third transmission gate and a fourth transmission gate;

the third transmission gate having a high voltage control end connected to the forward scan signal, a low voltage control end connected to the backward scan signal, an input end connected to the cascade signal of the (N−2)-th GOA unit, and an output end connected to the first node; the fourth transmission gate having a low voltage control end connected to the forward scan signal, a high voltage control end connected to the backward scan signal, an input end connected to the cascade signal of the (N+2)-th GOA unit, and an output end connected to the first node.

According to a preferred embodiment of the present invention, the output buffer module comprises an inverter, and the inverter has an input end connected to the cascade signal and an output end connected to the third node.

According to a preferred embodiment of the present invention, the reset module comprises a seventh TFT, and the seventh TFT is a P-type TFT and has a gate connected to the reset signal, a source connected to the constant high voltage signal and a drain connected to the cascade signal.

According to a preferred embodiment of the present invention, the output clock signals comprises four output clock signals: a first output clock signal, a second output clock signal, a third output clock signal, and a fourth output clock signal; when the M-th output clock signal is the third output clock signal, the (M+2)-th output clock signal is the first output clock signal; when the M-th output clock signal is the fourth output clock signal, the (M+2)-th output clock signal is the second output clock signal;

the GOA units of the cascaded odd-numbered stages are connected to the first output clock signal and the third output clock signal; the GOA units of the cascaded even-numbered stages are connected to the second output clock signal and the fourth output clock signal.

According to a preferred embodiment of the present invention, in the GOA units of the first stage and the second stage, the input end of the third transmission gate is connected to a start signal of the GOA circuit.

According to a preferred embodiment of the present invention, in the GOA units of the last stage and the second last stage, the input end of the fourth transmission gate is connected to a start signal of the GOA circuit.

According to a preferred embodiment of the present invention, the inverter comprises: an eighth TFT and a ninth TFT connected In series, the eighth TFT is a P-type TFT and the ninth TFT is an N-type TFT;

the eighth TFT and the ninth TFT have gates connected together to form the input end of the inverter, the eighth TFT has a source connected to the constant high voltage signal and the ninth TFT has a drain connected to the constant low voltage signal; a drain of the eighth TFT and a source of the ninth TFT connected together to form the output end of the inverter.

According to a preferred embodiment of the present invention, in forward scan, the forward scan signal is at high voltage and the backward scan signal is at low voltage;

in backward scan, the forward scan signal is at low voltage and the backward scan signal is at high voltage.

According to a preferred embodiment of the present invention, when scanning the GOA units of the (4K−3)-th and (4K−2)-th stages, the latch clock signal is at low voltage;

when scanning the GOA units of the K-th and (4K−1)-th stages, the latch clock signal is at high voltage.

According to a preferred embodiment of the present invention, when the GOA circuit applied to a display panel with a structure of dual-side driving and scan every other row, the GOA units of cascaded odd-numbered stages and the GOA units of cascaded even-numbered stages of the display panel are disposed respectively at left and right sides of the display panel.

Another embodiment of the present invention provides CMOS GOA circuit, which comprises a plurality of stages of GOA units, wherein the odd-numbered stages of GOA units being cascaded and the even-numbered stages of GOA units being cascaded;

each GOA unit comprising: a forward-and-backward scan control module, a latch module, an output buffer module, an output module, and a reset module;

for positive numbers N, M and K, other than the GOA units in the first stage, the second stage, the second last stage and the last stage, in each N-th GOA unit:

the forward-and-backward scan control module receiving a cascade signal from the (N−2)-th GOA unit, a cascade signal from the (N+2)-th GOA unit, a forward scan signal and a backward scan signal, for controlling the GOA circuit to perform forward scan or backward scan according to the voltage change of forward scan signal and the backward scan signal, and propagating the cascade signal of the (N−2)-th GOA unit or the cascade signal from the (N+2)-th GOA unit to a first node;

the latch module comprising: a first TFT, a second TFT, a third TFT, a fourth TFT, a fifth TFT, and a sixth TFT; wherein the first TFT, the second TFT and the fifth TFT being P-type TFT and the third TFT, the fourth TFT and the sixth TFT being N-type TFT;

the first TFT having a gate connected to the first node, a source connected to a first control signal and a drain connected to a second node; the second TFT having a gate connected to a cascade signal, a source connected to the first control signal and a drain connected to the second node; the third TFT having a gate connected to the cascade signal, a source connected to the second node and a drain connected to a source of the fourth TFT; the fourth TFT having a gate connected to the first node, a drain connected to a constant low voltage signal; the fifth TFT having a gate connected to the second node, a source connected to a constant high voltage signal and a drain connected to the cascade signal; and the sixth TFT having a gate connected to the second node, a source connected to a second control signal and a drain connected to the cascade signal;

the output buffer module connected to the cascade signal for inverting the cascade signal and propagating the inverted cascade signal to a third node;

the output module comprising: a first transmission gate and a second transmission gate;

the first transmission gate having a high voltage control end connected to the third node, a low voltage control end connected to the cascade signal, an input end connected to an M-th output clock signal, and an output end connected to a first scan signal; the second transmission gate having a high voltage control end connected to the third node, a low voltage control end connected to the cascade signal, an input end connected to an (M+2)-th output clock signal, and an output end connected to a second scan signal;

the reset module connected to a reset signal, the constant high voltage signal, and the cascade signal, for resetting the cascade signal to a high voltage, and the first scan signal and the second scan signal to a low voltage under the control of the reset signal;

in the GOA units of the (4K−3)-th and (4K−2)-th stages, the first control signal being the constant high voltage signal and the second control signal being a latch clock signal; in the GOA units of the K-th and (4K−1)-th stages, the first control signal being the latch clock signal and the second control signal being the constant low voltage signal;

wherein the forward-and-backward scan control module comprising: a third transmission gate and a fourth transmission gate;

the third transmission gate having a high voltage control end connected to the forward scan signal, a low voltage control end connected to the backward scan signal, an input end connected to the cascade signal of the (N−2)-th GOA unit, and an output end connected to the first node; the fourth transmission gate having a low voltage control end connected to the forward scan signal, a high voltage control end connected to the backward scan signal, an input end connected to the cascade signal of the (N+2)-th GOA unit, and an output end connected to the first node;

wherein the output buffer module comprising an inverter, and the inverter having an input end connected to the cascade signal and an output end connected to the third node.

wherein the reset module comprisings a seventh TFT, and the seventh TFT being a P-type TFT and having a gate connected to the reset signal, a source connected to the constant high voltage signal and a drain connected to the cascade signal.

The present invention provides the following advantages. The present invention provides a CMOS GOA circuit, which improves the NAND gate in the latch module and the inverter to connect the latch clock signal to the NAND gate in the latch module or the inverter to control the latch module to realize the input and latch of the cascade signal through the voltage change in the latch clock signal. Compared to the known technique, the present invention reduces the number of TFTs required by the latch module without affecting the normal operation of the circuit, and facilitates the implementation of the narrow border or borderless display products.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
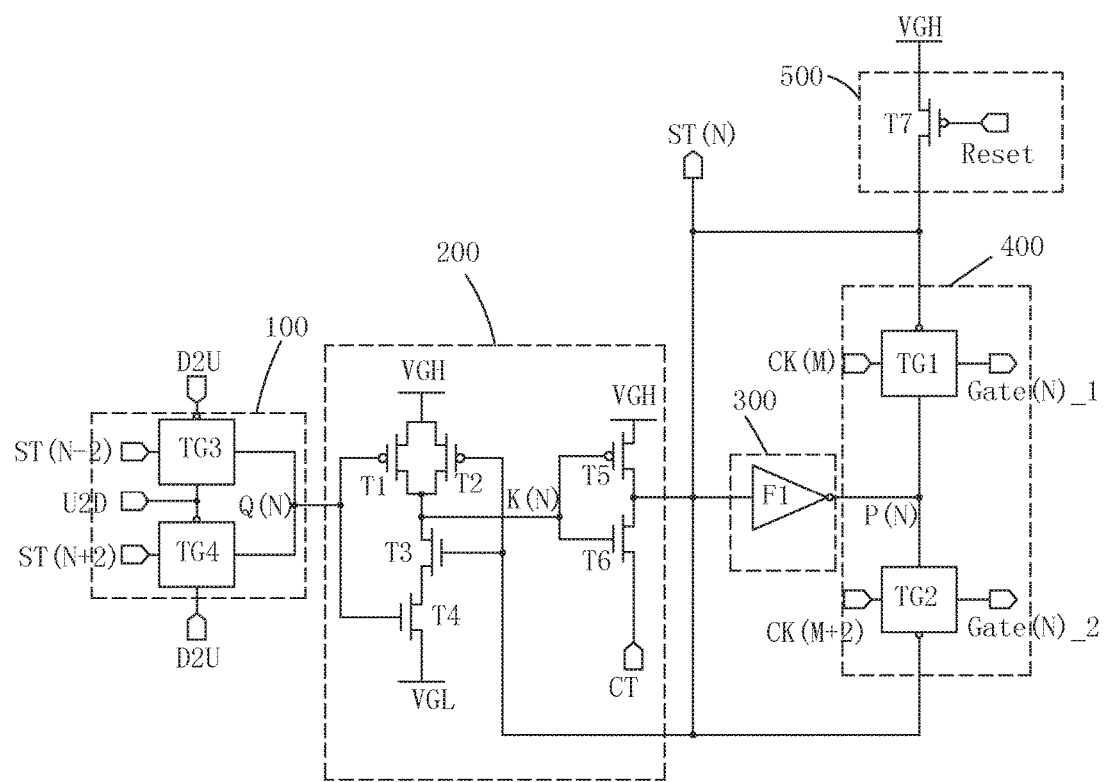
FIG. 1 is a schematic view showing a circuit of the GOA units of the (4K−3)-th or (4K−2)-th stages of the CMOS GOA circuit provided by an embodiment of the present invention.

Referring to FIG. 1, the present invention provides a structure of CMOS GOA circuit, which comprises: CMOS GOA circuit, which comprises a plurality of stages of GOA units, wherein the odd-numbered stages of GOA units being cascaded and the even-numbered stages of GOA units being cascaded.

Each GOA unit comprises: a forward-and-backward scan control module 100, a latch module 200, an output buffer module 300, an output module 400 and a reset module 500.

For positive numbers N, M and K, other than the GOA units in the first stage, the second stage, the second last stage and the last stage, in each N-th GOA unit:

The forward-and-backward scan control module 100 is connected to receive a cascade signal ST(N−2) from the (N−2)-th GOA unit, a cascade signal ST(N+2) from the (N+2)-th GOA unit, a forward scan signal U2D and a backward scan signal D2U, for controlling the GOA circuit to perform forward scan or backward scan according to the voltage change of forward scan signal U2D and the backward scan signal D2U, and propagating the cascade signal ST(N−2) of the (N−2)-th GOA unit or the cascade signal ST(N+2) from the (N+2)-th GOA unit to a first node Q(N).

The latch module 200 comprises: a first TFT T1, a second TFT T2, a third TFT T3, a fourth TFT T4, a fifth TFT T5, and a sixth TFT T6; wherein the first TFT T1, the second TFT T2 and the fifth TFT T5 are P-type TFT and the third TFT T3, the fourth TFT T4 and the sixth TFT T6 are N-type TFT.

The first TFT T1 has a gate connected to the first node Q(N), a source connected to a first control signal and a drain connected to a second node K(N); the second TFT T2 has a gate connected to a cascade signal ST(N), a source connected to the first control signal and a drain connected to the second node K(N); the third TFT T3 has a gate connected to the cascade signal ST(N), a source connected to the second node K(N) and a drain connected to a source of the fourth TFT T4; the fourth TFT T4 has a gate connected to the first node Q(N), a drain connected to a constant low voltage signal VGL; the fifth TFT T5 has a gate connected to the second node K(N), a source connected to a constant high voltage signal VGH and a drain connected to the cascade signal ST(N); and the sixth TFT T6 has a gate connected to the second node K(N), a source connected to a second control signal and a drain connected to the cascade signal ST(N).

The output buffer module 300 is connected to the cascade signal ST(N) for inverting the cascade signal ST(N) and propagating the inverted cascade signal ST(N) to a third node P(N).

The output module 400 comprises: a first transmission gate TG1 and a second transmission gate TG2; the first transmission gate TG1 has a high voltage control end connected to the third node P(N), a low voltage control end connected to the cascade signal ST(N), an input end connected to an M-th output clock signal CK(M), and an output end connected to a first scan signal Gate(N)_1; the second transmission gate TG2 has a high voltage control end connected to the third node P(N), a low voltage control end connected to the cascade signal ST(N), an input end connected to an (M+2)-th output clock signal CK(M+2), and an output end connected to a second scan signal Gate(N)_2.

The reset module 500 is connected to a reset signal Reset, the constant high voltage signal VGH, and the cascade signal ST(N), for resetting the cascade signal ST(N) to a high voltage, and the first scan signal Gate(N)_1 and the second scan signal Gate(N)_2 to a low voltage under the control of the reset signal Reset.

Figure 2:
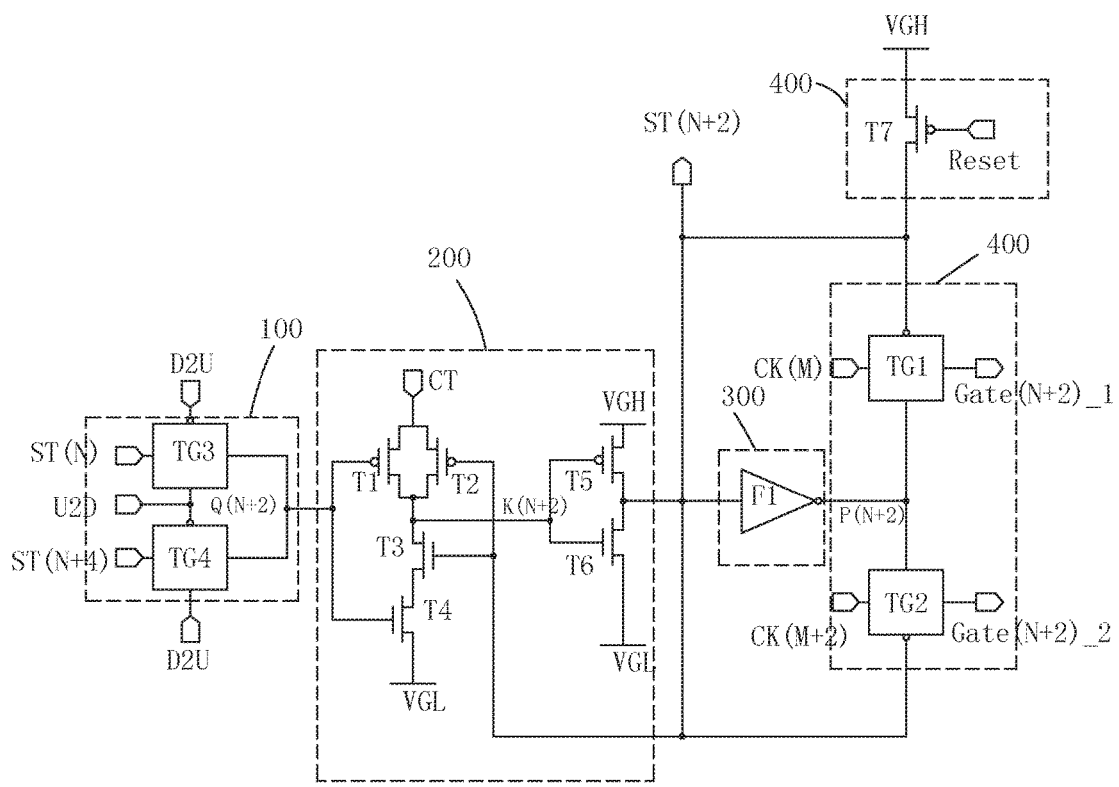
FIG. 2 is a schematic view showing a circuit of the GOA units of the 4K-th or (4K−1)-th stages of the CMOS GOA circuit provided by an embodiment of the present invention.
Figure 3:
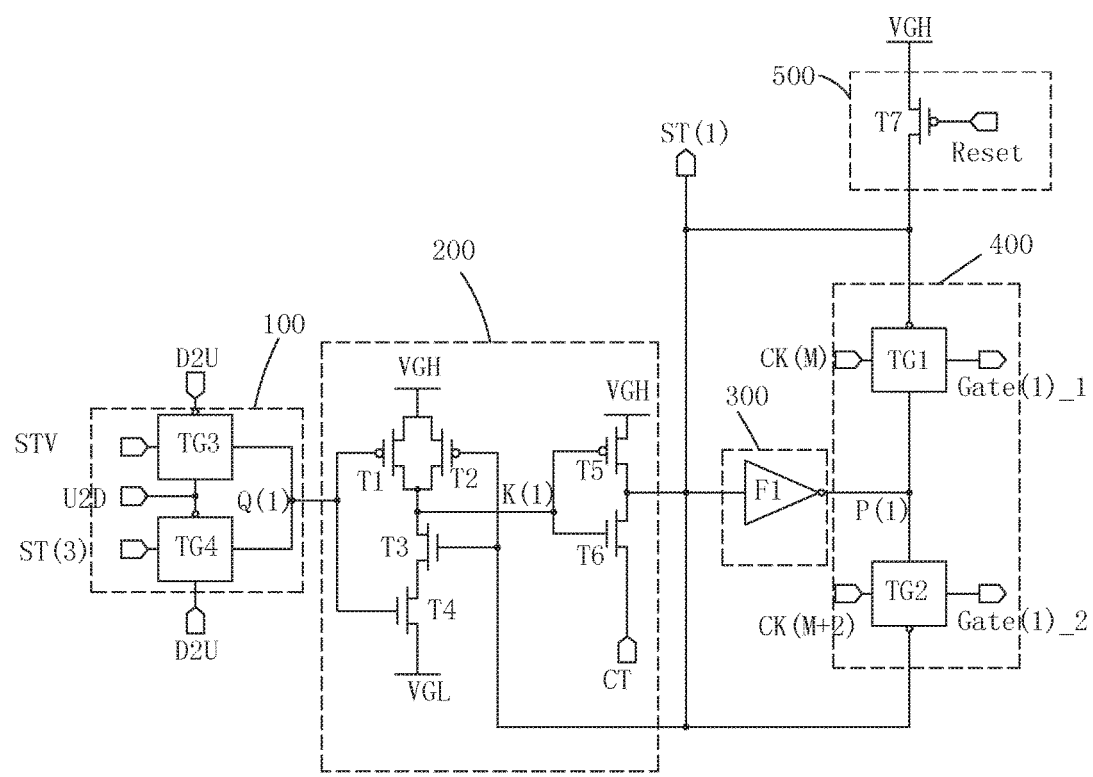
FIG. 3 is a schematic view showing a circuit of the GOA unit of the first stage of the CMOS GOA circuit provided by an embodiment of the present invention.
Figure 4:
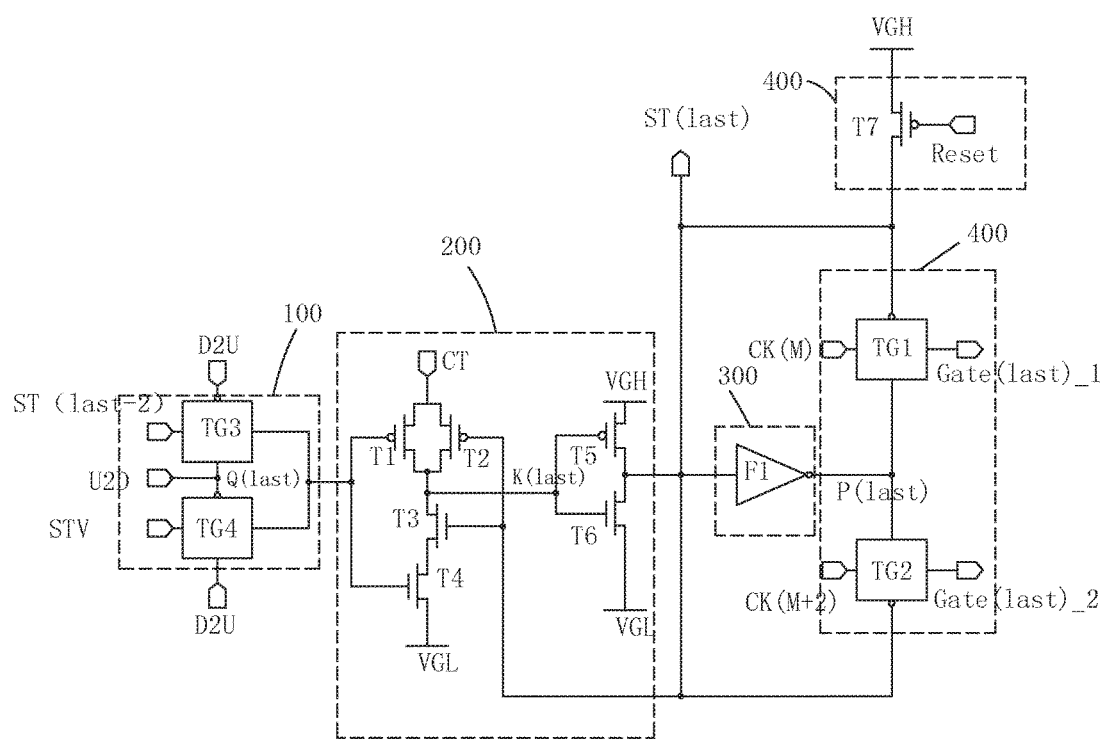
FIG. 4 is a schematic view showing a circuit of the GOA unit of the last stage of the CMOS GOA circuit provided by an embodiment of the present invention.
Figure 5:
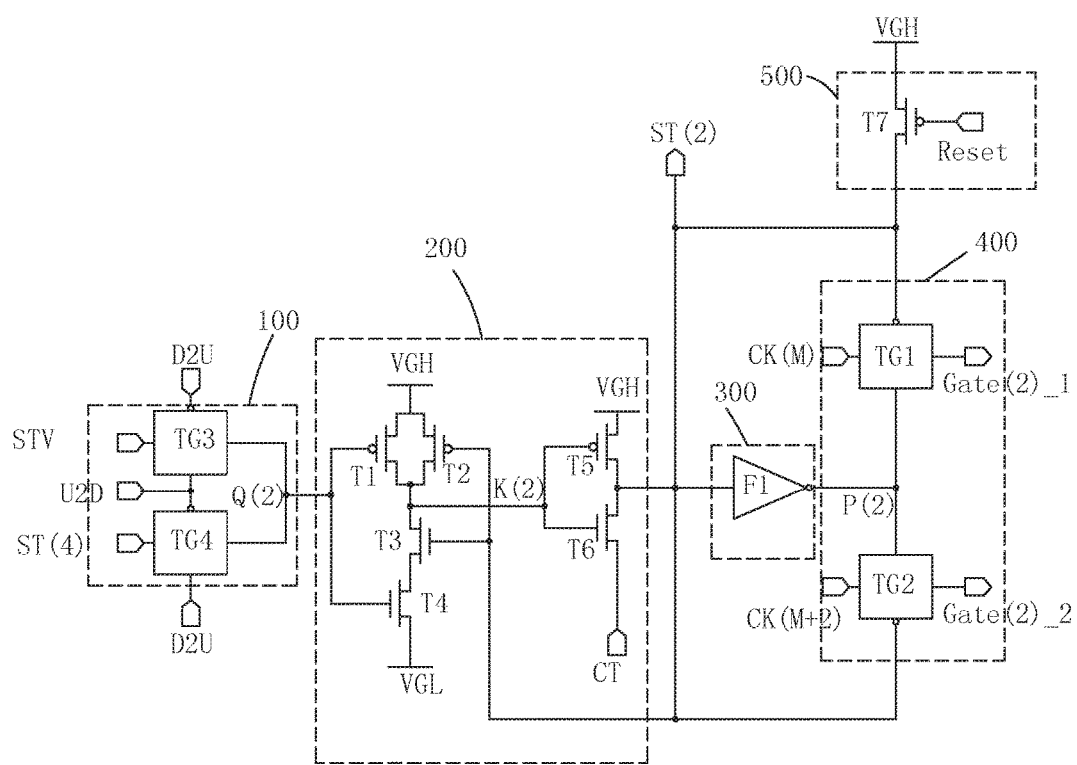
FIG. 5 is a schematic view showing a circuit of the GOA unit of the second stage of the CMOS GOA circuit provided by an embodiment of the present invention.
Figure 6:
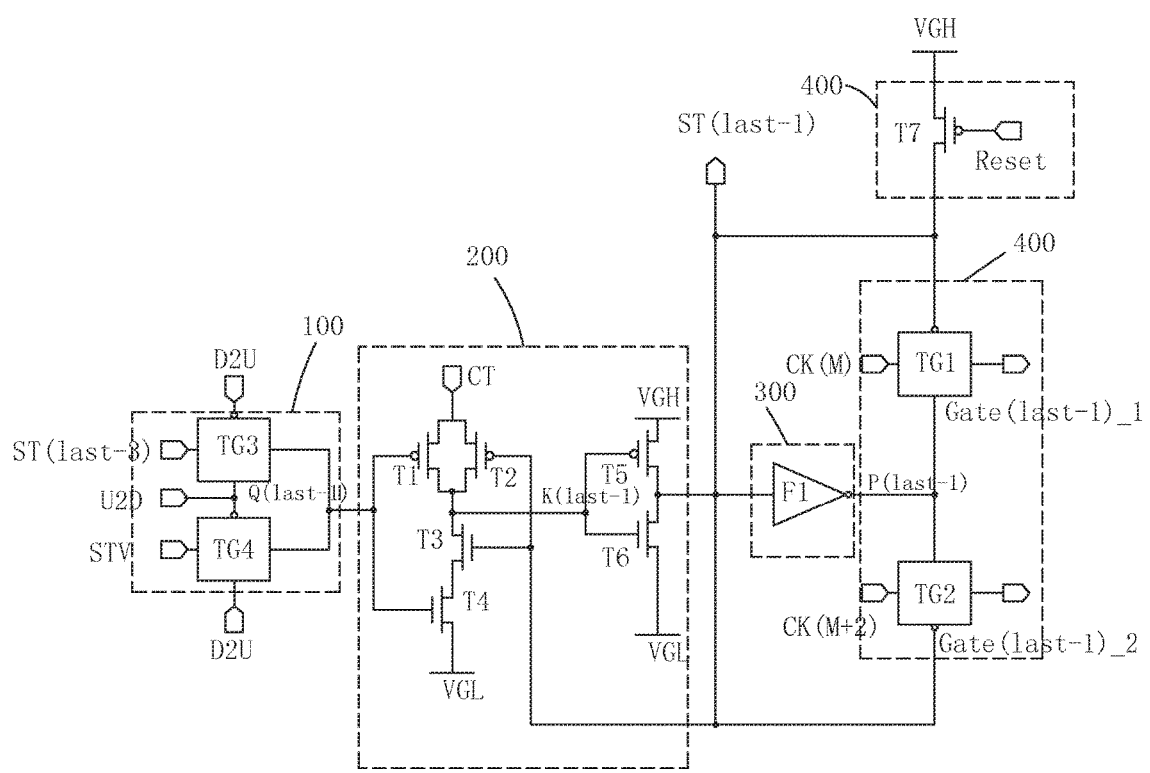
FIG. 6 is a schematic view showing a circuit of the GOA unit of the second last stage of the CMOS GOA circuit provided by an embodiment of the present invention.

It should be noted that, referring to FIG. 1, in the GOA units of the (4K−3)-th and (4K−2)-th stages, the first control signal is the constant high voltage signal VGH and the second control signal is a latch clock signal CT; referring to FIG. 2, in the GOA units of the K-th and (4K−1)-th stages, the first control signal is the latch clock signal CT and the second control signal is the constant low voltage signal VGL. In other words, for the GOA units of the odd-numbered stages, such as, for the first GOA unit, the first control signal is the constant high voltage signal VGH and the second control signal is a latch clock signal CT; for the third GOA unit, the first control signal is the latch clock signal CT and the second control signal is the constant low voltage signal VGL; for the fifth GOA unit, the first control signal is the constant high voltage signal VGH and the second control signal is a latch clock signal CT; for the seventh GOA unit, the first control signal is the latch clock signal CT and the second control signal is the constant low voltage signal VGL; and so on, until the GOA unit of the last odd-numbered stage. For the GOA units of the even-numbered stages, such as, for the second GOA unit, the first control signal is the constant high voltage signal VGH and the second control signal is a latch clock signal CT; for the fourth GOA unit, the first control signal is the latch clock signal CT and the second control signal is the constant low voltage signal VGL; for the sixth GOA unit, the first control signal is the constant high voltage signal VGH and the second control signal is a latch clock signal CT; for the eighth GOA unit, the first control signal is the latch clock signal CT and the second control signal is the constant low voltage signal VGL; and so on, until the GOA unit of the last even-numbered stage.

Figure 7:
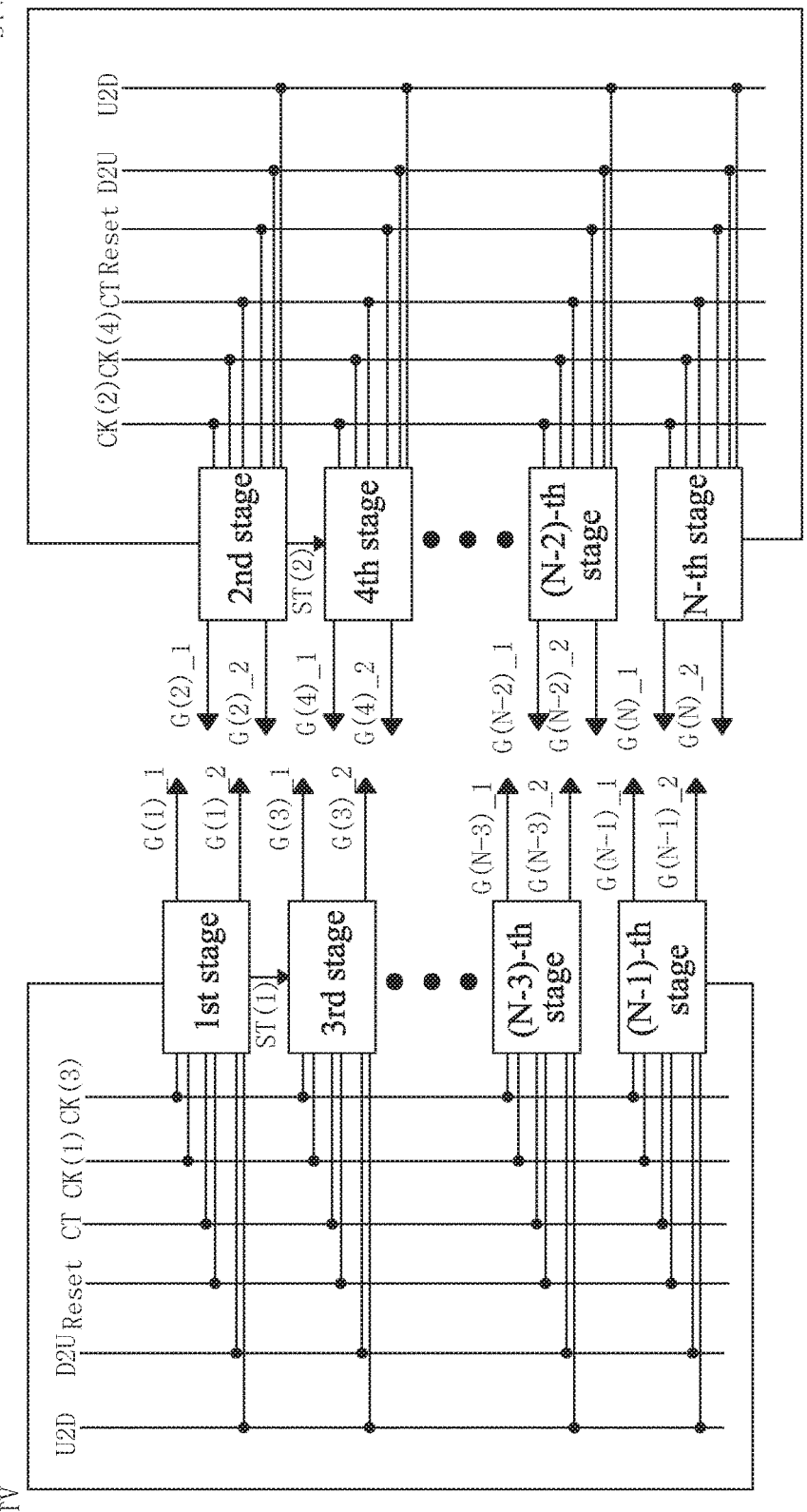
FIG. 7 is a schematic view showing a structure of the CMOS GOA circuit by an embodiment of the present invention.

Moreover, referring to FIG. 7, when the CMOS GA circuit of the present invention is applied to a display panel with a structure of dual-side driving and scan every other row, the GOA units of cascaded odd-numbered stages and the GOA units of cascaded even-numbered stages of the display panel are disposed respectively at left and right sides of the display panel. Each GOA unit of a stage outputs two scan signals, corresponding respectively to two scan lines inside the display panel. Take the forward scan as example. The output order of the CMOS GOA circuit is: the first scan signal G(1)_1 of the first GOA unit is outputted first, followed by the first scan signal G(2)_1 of the second GOA unit, followed by the second scan signal G(1)_2 of the first GOA unit, followed by the second scan signal G(2)_2 of the second GOA unit, followed by the first scan signal G(3)_1 of the third GOA unit, followed by the first scan signal G(4)_1 of the fourth GOA unit, followed by the second scan signal G(3)_2 of the third GOA unit, followed by the second scan signal G(4)_2 of the fourth GOA unit, and so on until the last GOA unit.

Specifically, the forward-and-backward scan control module 100 comprises: a third transmission gate TG3 and a fourth transmission gate TG4; wherein the third transmission gate TG3 has a high voltage control end connected to the forward scan signal U2D, a low voltage control end connected to the backward scan signal D2U, an input end connected to the cascade signal ST(N−2) of the (N−2)-th GOA unit, and an output end connected to the first node Q(N); the fourth transmission gate TG4 has a low voltage control end connected to the forward scan signal U2D, a high voltage control end connected to the backward scan signal D2U, an input end connected to the cascade signal ST(N+2) of the (N+2)-th GOA unit, and an output end connected to the first node Q(N).

Figure 10:
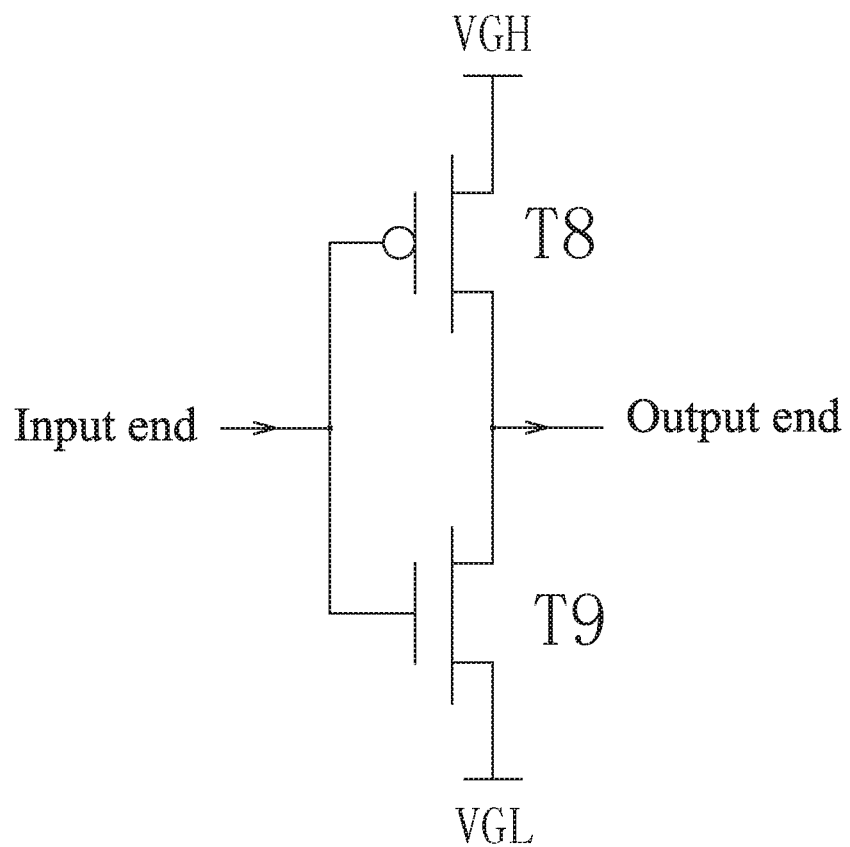
FIG. 10 is a schematic view showing a circuit of the inverter of the CMOS GOA circuit by an embodiment of the present invention

Specifically, the output buffer module 300 comprises an inverter F1, and the inverter has an input end connected to the cascade signal ST(N) and an output end connected to the third node P(N). Moreover, Refer to FIG. 10. The inverter F1 comprises: an eighth TFT T8 and a ninth TFT T9 connected In series, the eighth TFT T8 is a P-type TFT and the ninth TFT T9 is an N-type TFT; the eighth TFT T8 and the ninth TFT T9 have gates connected together to form the input end of the inverter F1, the eighth TFT T8 has a source connected to the constant high voltage signal VGH and the ninth TFT T9 has a drain connected to the constant low voltage signal VGL; a drain of the eighth TFT T8 and a source of the ninth TFT T9 connected together to form the output end of the inverter F1.

Specifically, the reset module 500 comprises a seventh TFT T7, and the seventh TFT T7 is a P-type TFT and has a gate connected to the reset signal Reset, a source connected to the constant high voltage signal VGH and a drain connected to the cascade signal ST(N).

Specifically, the output clock signals comprises four output clock signals: a first output clock signal CK(1), a second output clock signal CK(2), a third output clock signal CK(3) and a fourth output clock signal CK(4); when the M-th output clock signal CK(M) is the third output clock signal CK(3), the (M+2)-th output clock signal CK(M+2) is the first output clock signal CK(1); when the M-th output clock signal CK(M) is the fourth output clock signal CK(4), the (M+2)-th output clock signal CK(M+2) is the second output clock signal CK(2); wherein the GOA units of the cascaded odd-numbered stages are connected to the first output clock signal CK(1) and the third output clock signal CK(3); the GOA units of the cascaded even-numbered stages are connected to the second output clock signal CK(2) and the fourth output clock signal CK(4). The falling edge of a previous output clock signal is generated simultaneously with the rising edge of a next output clock signal.

It should be noted that, referring to FIGS. 3-6, in the GOA units of the first stage and the second stage, the input end of the third transmission gate TG3 is connected to a start signal of the GOA circuit STV, while in the GOA units of the last stage and the second last stage, the input end of the fourth transmission gate TG4 is connected to the start signal STV of the GOA circuit.

Figure 8:
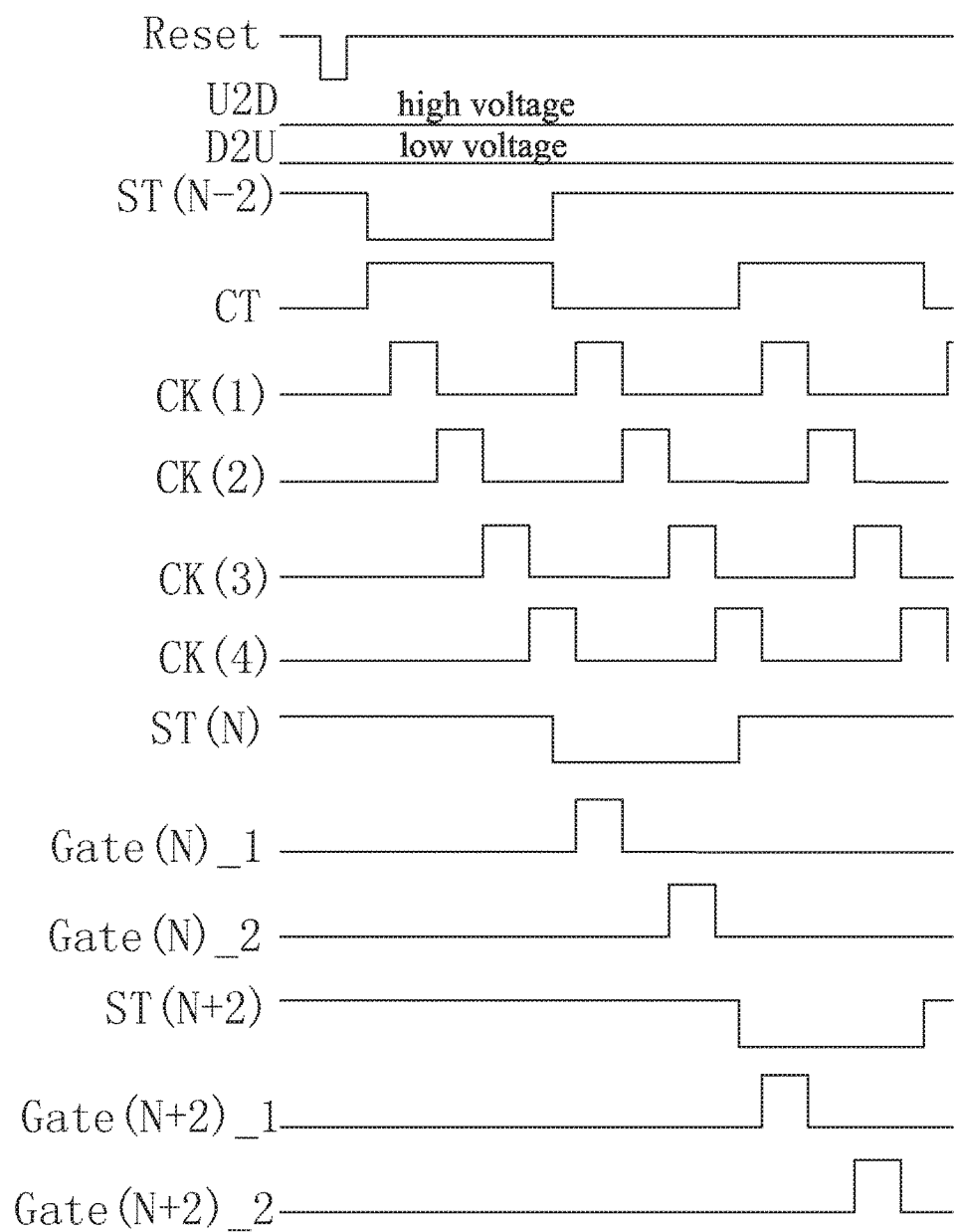
FIG. 8 is a schematic view showing a forward scan timing of the CMOS GOA circuit by an embodiment of the present invention.
Figure 9:
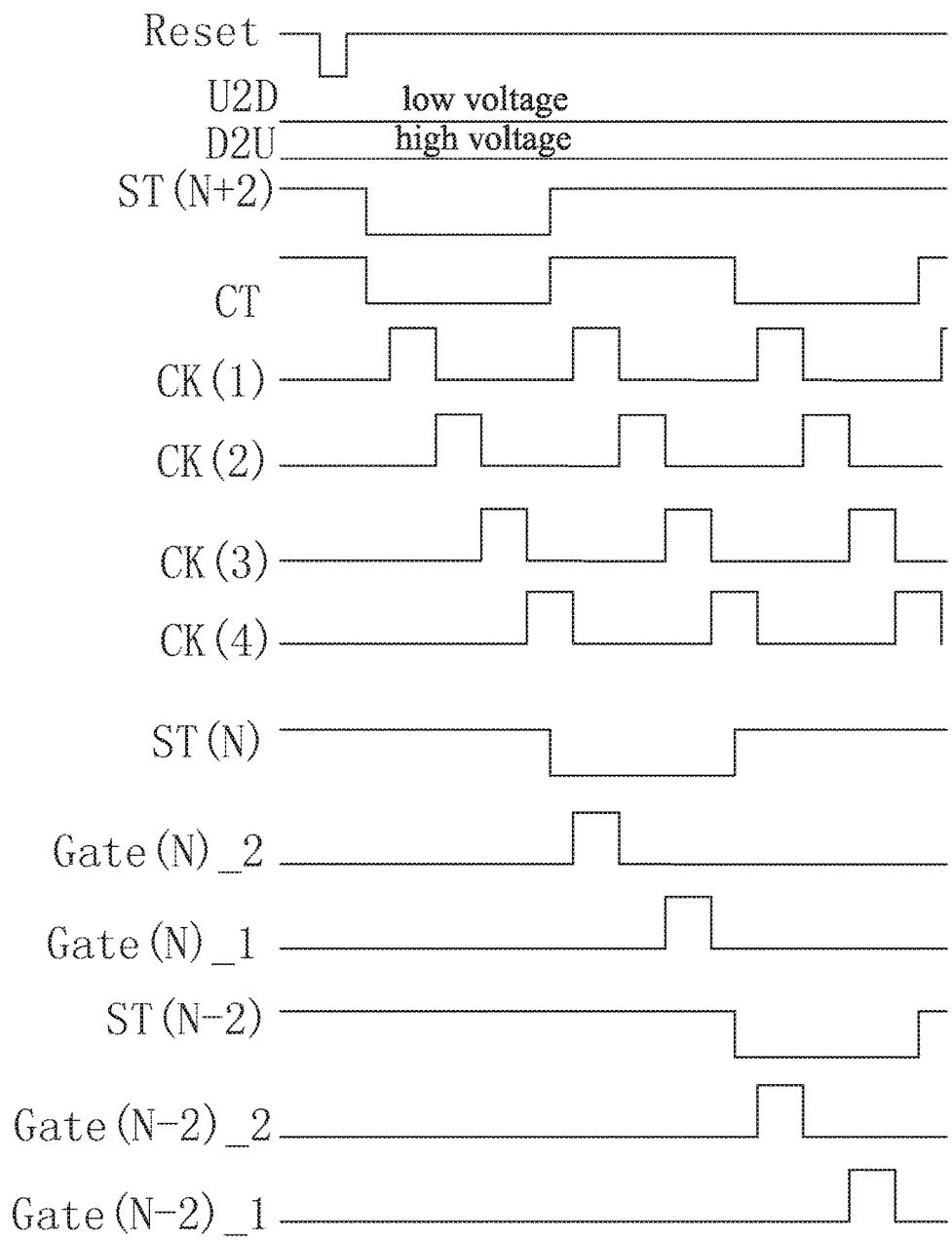
FIG. 9 is a schematic view showing a backward scan timing of the CMOS GOA circuit by an embodiment of the present invention.

Refer to FIG. 8 and FIG. 9. In forward scan, the forward scan signal U2D is at high voltage and the backward scan signal D2U is at low voltage; in backward scan, the forward scan signal U2D is at low voltage and the backward scan signal D2U is at high voltage. When scanning the GOA units of the (4K−3)-th and (4K−2)-th stages, the latch clock signal CT is at low voltage; when scanning the GOA units of the K-th and (4K−1)-th stages, the latch clock signal CT is at high voltage.

Specifically, refer to FIG. 8. FIG. 8 is a schematic view showing a forward scan timing of the CMOS GOA circuit by an embodiment of the present invention. The forward scan signal U2D is at high voltage and the backward scan signal D2U is at low voltage. The third transmission gate TG3 is turned on and the fourth transmission gate TG4 is turned off. The cascade signal ST(N−2) of (N−2)-th GOA unit provides a low voltage, the first node Q(N) is at low voltage, the first TFT T1 is turned on, the constant high voltage signal VGH is outputted to the second node K(N), the sixth TFT T6 is turned on, the latch clock signal CT provides a high voltage, the cascade sign ST(N) is at high voltage, the third node P(N) is at low voltage, and the first and the second transmission gates TG1, TG2 are turned off. Then, the cascade signal ST(N−2) of (N−2)-th GOA unit becomes high voltage and the latch clock signal CT becomes low voltage. The cascade signal ST(N) becomes low voltage, the third node P(N) is at high voltage, the first and the second transmission gates TG1, TG2 are turned on, and the M-th and the (M+2)-th output clock signals CK(M), CK(M+2) output. At this point, in the (N+2)-th GOA unit, the third transmission gate TG3 receives a low-voltage cascade signal ST(N), so that the first node Q(N+2) of the (N+2)-th GOA unit becomes low voltage, the first TFT T1 is turned on, the low voltage at the latch clock signal CT is transmitted to the second node K(N+2), the fifth TFT T5 is turned on, the cascade signal ST(N+2) of (N+2)-th GOA unit becomes high voltage, the third node P(N+2) is low voltage, the first and the second transmission gates TG1, TG2 are turned off. Then, the cascade signal ST(N) and the latch clock signal CT become high voltage simultaneously, the sixth TFT T6 is turned on, the cascade signal ST(N+2) of (N+2)-th GOA unit becomes low voltage, the third node P(N+2) becomes high voltage, the first and the second transmission gates TG1, TG2 are turned on, and the M-th and the (M+2)-th output clock signals CK(M), CK(M+2) output, and so on until the last stage.

Moreover, when the scanning starts, the reset signal Reset provides a low voltage pulse to turn on the seventh TFT T7 of all the GOA units, the constant high voltage signal VGH writes into the cascade signals ST(N) of all GOA units to reset to high voltage, the third node P(N) is low voltage, the first and the second transmission gates TG1, TG2 are turned off, and the first and the second scan signals Gate(N)_1, Gate(N)_2 are reset to low voltage.

Refer to FIG. 9. FIG. 9 is a schematic view showing a backward scan timing of the CMOS GOA circuit by an embodiment of the present invention. The operation process is similar to the forward scan operation, with the only difference in scan direction. In forward scan, the scanning starts from the first stage to the last stage, and in backward scan, the scanning starts from the last stage to the first stage. The details of the backward scan will not be described here.

In summary, the present invention provides a CMOS GOA circuit, which improves the NAND gate in the latch module and the inverter to connect the latch clock signal to the NAND gate in the latch module or the inverter to control the latch module to realize the input and latch of the cascade signal through the voltage change in the latch clock signal. Compared to the known technique, the present invention reduces the number of TFTs required by the latch module without affecting the normal operation of the circuit, and facilitates the implementation of the narrow border or borderless display products.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A complimentary metal-oxide-semiconductor (CMOS) gate driver on array (GOA) circuit, comprising: a plurality of stages of GOA units, wherein the odd-numbered stages of GOA units being cascaded and the even-numbered stages of GOA units being cascaded;

each GOA unit comprising: a forward-and-backward scan control module, a latch module, an output buffer module, an output module, and a reset module;

for positive numbers N, M and K, other than the GOA units in the first stage, the second stage, the second last stage and the last stage, in each N-th GOA unit:

the forward-and-backward scan control module receiving a cascade signal from the (N−2)-th GOA unit, a cascade signal from the (N+2)-th GOA unit, a forward scan signal and a backward scan signal, for controlling the GOA circuit to perform forward scan or backward scan according to the voltage change of forward scan signal and the backward scan signal, and propagating the cascade signal of the (N−2)-th GOA unit or the cascade signal from the (N+2)-th GOA unit to a first node;

the latch module comprising: a first thin film transistor (TFT), a second TFT, a third TFT, a fourth TFT, a fifth TFT, and a sixth TFT; wherein the first TFT, the second TFT and the fifth TFT being P-type TFT and the third TFT, the fourth TFT and the sixth TFT being N-type TFT;

the first TFT having a gate connected to the first node, a source connected to a first control signal and a drain connected to a second node; the second TFT having a gate connected to a cascade signal, a source connected to the first control signal and a drain connected to the second node; the third TFT having a gate connected to the cascade signal, a source connected to the second node and a drain connected to a source of the fourth TFT; the fourth TFT having a gate connected to the first node, a drain connected to a constant low voltage signal; the fifth TFT having a gate connected to the second node, a source connected to a constant high voltage signal and a drain connected to the cascade signal; and the sixth TFT having a gate connected to the second node, a source connected to a second control signal and a drain connected to the cascade signal;

the output buffer module connected to the cascade signal for inverting the cascade signal and propagating the inverted cascade signal to a third node;

the output module comprising: a first transmission gate and a second transmission gate;

the first transmission gate having a high voltage control end connected to the third node, a low voltage control end connected to the cascade signal, an input end connected to an M-th output clock signal, and an output end connected to a first scan signal; the second transmission gate having a high voltage control end connected to the third node, a low voltage control end connected to the cascade signal, an input end connected to an (M+2)-th output clock signal, and an output end connected to a second scan signal;

the reset module connected to a reset signal, the constant high voltage signal, and the cascade signal, for resetting the cascade signal to a high voltage, and the first scan signal and the second scan signal to a low voltage under the control of the reset signal;

in the GOA units of the (4K−3)-th and (4K−2)-th stages, the first control signal being the constant high voltage signal and the second control signal being a latch clock signal; in the GOA units of the K-th and (4K−1)-th stages, the first control signal being the latch clock signal and the second control signal being the constant low voltage signal.

2. The CMOS GOA circuit as claimed in claim 1, wherein the forward-and-backward scan control module comprises: a third transmission gate and a fourth transmission gate;

Wherein the third transmission gate has a high voltage control end connected to the forward scan signal, a low voltage control end connected to the backward scan signal, an input end connected to the cascade signal of the (N−2)-th GOA unit, and an output end connected to the first node; the fourth transmission gate has a low voltage control end connected to the forward scan signal, a high voltage control end connected to the backward scan signal, an input end connected to the cascade signal of the (N+2)-th GOA unit, and an output end connected to the first node.

3. The CMOS GOA circuit as claimed in claim 1, wherein the output buffer module comprises an inverter, and the inverter has an input end connected to the cascade signal and an output end connected to the third node.

4. The CMOS GOA circuit as claimed in claim 1, wherein the reset module comprises a seventh TFT, and the seventh TFT is a P-type TFT and has a gate connected to the reset signal, a source connected to the constant high voltage signal and a drain connected to the cascade signal.

5. The CMOS GOA circuit as claimed in claim 1, wherein the output clock signals comprises four output clock signals: a first output clock signal, a second output clock signal, a third output clock signal, and a fourth output clock signal; when the M-th output clock signal is the third output clock signal, the (M+2)-th output clock signal is the first output clock signal; when the M-th output clock signal is the fourth output clock signal, the (M+2)-th output clock signal is the second output clock signal;

the GOA units of the cascaded odd-numbered stages are connected to the first output clock signal and the third output clock signal; the GOA units of the cascaded even-numbered stages are connected to the second output clock signal and the fourth output clock signal.

6. The CMOS GOA circuit as claimed in claim 2, wherein in the GOA units of the first stage and the second stage, the input end of the third transmission gate is connected to a start signal of the GOA circuit;

in the GOA units of the last stage and the second last stage, the input end of the fourth transmission gate is connected to the start signal of the GOA circuit.

7. The CMOS GOA circuit as claimed in claim 3, wherein the inverter comprises: an eighth TFT and a ninth TFT connected in series, the eighth TFT is a P-type TFT and the ninth TFT is an N-type TFT;

the eighth TFT and the ninth TFT have gates connected together to form the input end of the inverter, the eighth TFT has a source connected to the constant high voltage signal and the ninth TFT has a drain connected to the constant low voltage signal; a drain of the eighth TFT and a source of the ninth TFT connected together to form the output end of the inverter.

8. The CMOS GOA circuit as claimed in claim 2, wherein in forward scan, the forward scan signal is at high voltage and the backward scan signal is at low voltage;

in backward scan, the forward scan signal is at low voltage and the backward scan signal is at high voltage.

9. The CMOS GOA circuit as claimed in claim 1, wherein when scanning the GOA units of the (4K−3)-th and (4K−2)-th stages, the latch clock signal is at low voltage;

when scanning the GOA units of the K-th and (4K−1)-th stages, the latch clock signal is at high voltage.

10. The CMOS GOA circuit as claimed in claim 1, wherein when the GOA circuit applied to a display panel with a structure of dual-side driving and scan every other row, the GOA units of cascaded odd-numbered stages and the GOA units of cascaded even-numbered stages of the display panel are disposed respectively at left and right sides of the display panel.

11. A complimentary metal-oxide-semiconductor (CMOS) gate driver on array (GOA) circuit, comprising: a plurality of stages of GOA units, wherein the odd-numbered stages of GOA units being cascaded and the even-numbered stages of GOA units being cascaded;

each GOA unit comprising: a forward-and-backward scan control module, a latch module, an output buffer module, an output module, and a reset module;

for positive numbers N, M and K, other than the GOA units in the first stage, the second stage, the second last stage and the last stage, in each N-th GOA unit:

the forward-and-backward scan control module receiving a cascade signal from the (N−2)-th GOA unit, a cascade signal from the (N+2)-th GOA unit, a forward scan signal and a backward scan signal, for controlling the GOA circuit to perform forward scan or backward scan according to the voltage change of forward scan signal and the backward scan signal, and propagating the cascade signal of the (N−2)-th GOA unit or the cascade signal from the (N+2)-th GOA unit to a first node;

the latch module comprising: a first thin film transistor (TFT), a second TFT, a third TFT, a fourth TFT, a fifth TFT, and a sixth TFT; wherein the first TFT, the second TFT and the fifth TFT being P-type TFT and the third TFT, the fourth TFT and the sixth TFT being N-type TFT;

the first TFT having a gate connected to the first node, a source connected to a first control signal and a drain connected to a second node; the second TFT having a gate connected to a cascade signal, a source connected to the first control signal and a drain connected to the second node; the third TFT having a gate connected to the cascade signal, a source connected to the second node and a drain connected to a source of the fourth TFT; the fourth TFT having a gate connected to the first node, a drain connected to a constant low voltage signal; the fifth TFT having a gate connected to the second node, a source connected to a constant high voltage signal and a drain connected to the cascade signal; and the sixth TFT having a gate connected to the second node, a source connected to a second control signal and a drain connected to the cascade signal;

the output buffer module connected to the cascade signal for inverting the cascade signal and propagating the inverted cascade signal to a third node;

the output module comprising: a first transmission gate and a second transmission gate;

the first transmission gate having a high voltage control end connected to the third node, a low voltage control end connected to the cascade signal, an input end connected to an M-th output clock signal, and an output end connected to a first scan signal; the second transmission gate having a high voltage control end connected to the third node, a low voltage control end connected to the cascade signal, an input end connected to an (M+2)-th output clock signal, and an output end connected to a second scan signal;

the reset module connected to a reset signal, the constant high voltage signal, and the cascade signal, for resetting the cascade signal to a high voltage, and the first scan signal and the second scan signal to a low voltage under the control of the reset signal;

in the GOA units of the (4K−3)-th and (4K−2)-th stages, the first control signal being the constant high voltage signal and the second control signal being a latch clock signal; in the GOA units of the K-th and (4K−1)-th stages, the first control signal being the latch clock signal and the second control signal being the constant low voltage signal;

wherein the forward-and-backward scan control module comprising: a third transmission gate and a fourth transmission gate;

wherein the third transmission gate having a high voltage control end connected to the forward scan signal, a low voltage control end connected to the backward scan signal, an input end connected to the cascade signal of the (N−2)-th GOA unit, and an output end connected to the first node; the fourth transmission gate having a low voltage control end connected to the forward scan signal, a high voltage control end connected to the backward scan signal, an input end connected to the cascade signal of the (N+2)-th GOA unit, and an output end connected to the first node;

wherein the output buffer module comprising an inverter, and the inverter having an input end connected to the cascade signal and an output end connected to the third node;

wherein the reset module comprising a seventh TFT, and the seventh TFT being a P-type TFT and having a gate connected to the reset signal, a source connected to the constant high voltage signal and a drain connected to the cascade signal.

12. The CMOS GOA circuit as claimed in claim 11, wherein the output clock signals comprises four output clock signals: a first output clock signal, a second output clock signal, a third output clock signal, and a fourth output clock signal; when the M-th output clock signal is the third output clock signal, the (M+2)-th output clock signal is the first output clock signal; when the M-th output clock signal is the fourth output clock signal, the (M+2)-th output clock signal is the second output clock signal;

the GOA units of the cascaded odd-numbered stages are connected to the first output clock signal and the third output clock signal; the GOA units of the cascaded even-numbered stages are connected to the second output clock signal and the fourth output clock signal.

13. The CMOS GOA circuit as claimed in claim 11, wherein in the GOA units of the first stage and the second stage, the input end of the third transmission gate is connected to a start signal of the GOA circuit;

in the GOA units of the last stage and the second last stage, the input end of the fourth transmission gate is connected to the start signal of the GOA circuit.

14. The CMOS GOA circuit as claimed in claim 11, wherein the inverter comprises: an eighth TFT and a ninth TFT connected in series, the eighth TFT is a P-type TFT and the ninth TFT is an N-type TFT;

the eighth TFT and the ninth TFT have gates connected together to form the input end of the inverter, the eighth TFT has a source connected to the constant high voltage signal and the ninth TFT has a drain connected to the constant low voltage signal; a drain of the eighth TFT and a source of the ninth TFT connected together to form the output end of the inverter.

15. The CMOS GOA circuit as claimed in claim 11, wherein in forward scan, the forward scan signal is at high voltage and the backward scan signal is at low voltage;

in backward scan, the forward scan signal is at low voltage and the backward scan signal is at high voltage.

16. The CMOS GOA circuit as claimed in claim 11, wherein when scanning the GOA units of the (4K−3)-th and (4K−2)-th stages, the latch clock signal is at low voltage;

when scanning the GOA units of the K-th and (4K−1)-th stages, the latch clock signal is at high voltage.

17. The CMOS GOA circuit as claimed in claim 11, wherein when the GOA circuit applied to a display panel with a structure of dual-side driving and scan every other row, the GOA units of cascaded odd-numbered stages and the GOA units of cascaded even-numbered stages of the display panel are disposed respectively at left and right sides of the display panel.

* * * * *